(12) United States Patent
Akiyama

(10) Patent No.: US 8,975,159 B2
(45) Date of Patent: Mar. 10, 2015

(54) METHOD FOR MANUFACTURING BONDED WAFER

(75) Inventor: Shoji Akiyama, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 143 days.

(21) Appl. No.: 13/318,944

(22) PCT Filed: May 6, 2010

(86) PCT No.: PCT/JP2010/057774
§ 371 (c)(1),
(2), (4) Date: Jan. 30, 2012

(87) PCT Pub. No.: WO2010/128666
PCT Pub. Date: Nov. 11, 2010

(65) Prior Publication Data
US 2012/0119336 A1    May 17, 2012

(30) Foreign Application Priority Data

May 7, 2009   (JP) ................................ 2009-112658

(51) Int. Cl.
H01L 21/301 (2006.01)
H01L 21/762 (2006.01)

(52) U.S. Cl.
CPC .............................. *H01L 21/76254* (2013.01)
USPC ....................................................... 438/458

(58) Field of Classification Search
CPC ............... H01L 21/3105; H01L 29/12; H01L 21/76254
USPC ............ 257/629, E29.068, E21.568; 438/458
See application file for complete search history.

(56) References Cited

U.S. PATENT DOCUMENTS 5,374,564 A    12/1994   Bruel
6,263,941 B1    7/2001   Bryan et al.
(Continued)

FOREIGN PATENT DOCUMENTS

EP    1 806 769 A1    7/2007
EP    1 986 218 A1    10/2008
(Continued)

OTHER PUBLICATIONS

European Patent Office, Supplementary European Search Report on Corresponding Application No. EP 10 77 2184, Dated Nov. 16, 2012.

*Primary Examiner* — Fernando L Toledo
*Assistant Examiner* — Neil Prasad
(74) *Attorney, Agent, or Firm* — Roberts Mlotkowski Safran & Cole, P.C.; David S. Safran

(57) ABSTRACT

A method for manufacturing a bonded wafer having a semiconductor film on a handle substrate involving the steps of: implanting ions into a semiconductor substrate to form an ion-implanted layer; subjecting the surface of at least one of the semiconductor substrate and the handle substrate to a surface activation treatment; bonding the surface of the semiconductor substrate to the surface of the handle substrate at a temperature from 50° C. to 350° C.; heating the bonded substrates at a maximum temperature from 200° C. to 350° C. to obtain a bonded body; and transferring a semiconductor film to the handle substrate by subjecting the bonded body to a temperature 30° C. to 100° C. higher than the bonding temperature, and irradiating the bonded body with visible light from a handle or semiconductor substrate side toward the ion-implanted layer of the semiconductor substrate to embrittle the interface of the ion-implanted layer.

11 Claims, 4 Drawing Sheets

(56) References Cited

U.S. PATENT DOCUMENTS

| | | |
|---|---|---|
| 6,513,564 B2 | 2/2003 | Bryan et al. |
| 6,582,999 B2 | 6/2003 | Henley et al. |
| 6,632,724 B2 * | 10/2003 | Henley et al. ............... 438/455 |
| RE39,484 E | 2/2007 | Bruel |
| 7,727,846 B2 | 6/2010 | Ohnuma et al. |
| 7,728,348 B2 | 6/2010 | Kasai et al. |
| 2005/0048738 A1 | 3/2005 | Shaheen et al. |
| 2009/0011575 A1 | 1/2009 | Shimomura et al. |
| 2009/0029525 A1 | 1/2009 | Ohnuma |

FOREIGN PATENT DOCUMENTS

| | | |
|---|---|---|
| JP | 5-211128 A | 8/1993 |
| JP | 2008-10766 A | 1/2008 |
| JP | 2009-33136 A | 2/2009 |
| JP | 2009-49387 A | 3/2009 |

* cited by examiner

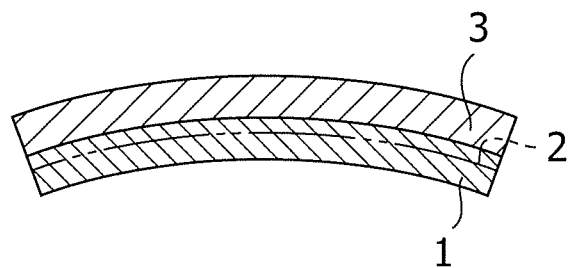
FIG.2
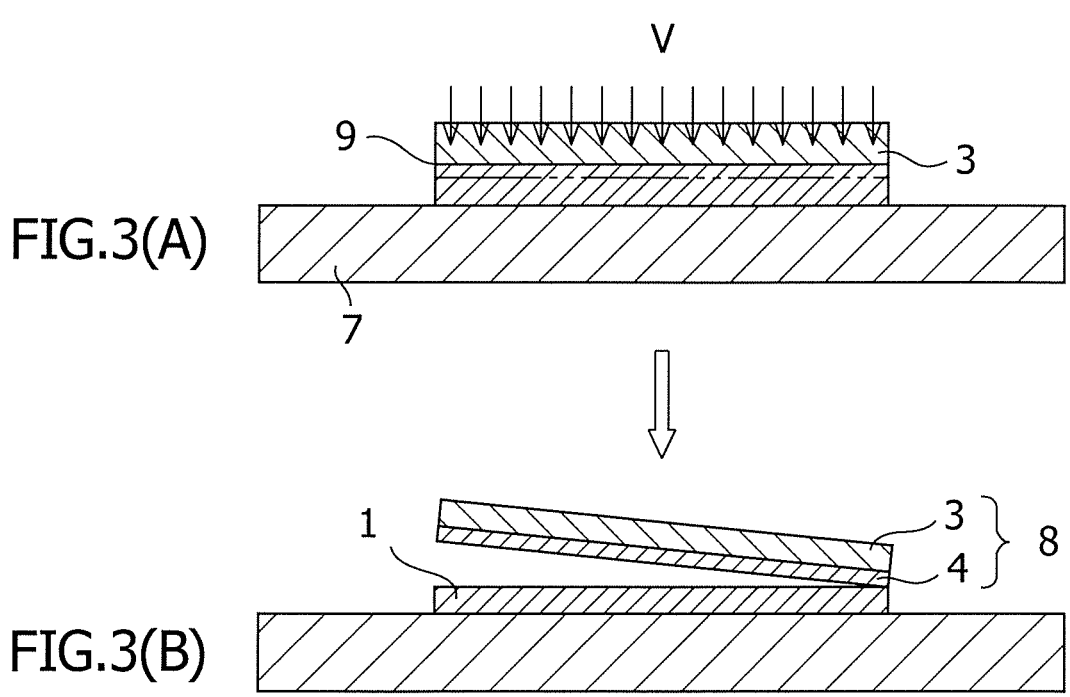
FIG.3(A)
FIG.3(B)

RMS: 0.130nm
Ra:　0.103nm

RMS: 0.281nm
Ra:　0.216nm

RMS: 4.711nm
Ra:　3.857nm

METHOD FOR MANUFACTURING BONDED WAFER

BACKGROUND OF THE INVENTION

1. Field of the Invention

The present invention relates to a method for manufacturing a bonded wafer.

2. Description of Related Art

There have been suggested SOI which is also known as Silicon on Quartz (SOQ), Silicon on Glass (SOG) or Silicon on Sapphire (SOS), wherein a handle substrate is made of a transparent insulating substrate, and a bonded wafer which is obtained by combining a handle substrate formed of silicon or the like with a transparent wide-gap semiconductor such as GaN, ZnO, diamond or AlN (in this case, the semiconductor substrate is transparent). These are expected to be applicable to various applications. The SOQ, SOG, SOS and the like are expected to be useful in applications such as projectors and high frequency devices because of the insulating properties, transparency and the like of the handle substrate. Furthermore, a bonded wafer in which a wide-gap semiconductor film is placed on a handle substrate, contains a highly expensive wide-gap semiconductor material only in an amount of forming a thickness of several hundred nanometers to several micrometers so that there is a possibility for promoting significant cost reduction. Therefore, the bonded wafer is expected to be applicable to high performance lasers, power devices and the like.

The conventional SOI production technology associated with bonding is divided mainly into two kinds of methods.

One of the methods is a SOITEC method, by which a silicon substrate (donor substrate) that has been implanted with hydrogen ions and a substrate (handle substrate) that serves as a supporting substrate are bonded at a room temperature, subjected to a heat treatment at high temperature (around 500° C.) to generate a large number of micro air bubbles called microcavities at the ion implantation interface, and subjected to detachment for transferring a silicon film onto the handle substrate.

The other is a method called a SiGen method, by which a silicon substrate that has been implanted with hydrogen ions and a handle substrate are respectively plasma-treated for activating their surfaces, bonded, and subjected to mechanical detachment at the hydrogen ion implantation interface.

However, since combination of these materials involves bonding of different kinds of substrates, the coefficients of thermal expansion of the semiconductor substrate and the donor substrate do not coincide. In regard to the SOITEC method, since the heat treatment at high temperature (about 500° C.) for thermal detachment at the hydrogen ion implantation interface is carried out after bonding, there is a drawback in the case of bonding different types of substrates as described above, that the substrates develop cracks because of a large difference in the coefficient of thermal expansion. Furthermore, in regard to the SiGen method, bonding the surface-activated surfaces results in a higher bonding strength as compared with the SOITEC method, and a high bonding strength is obtained by a subsequent heat treatment at a relatively low temperature of about 250° C. to 350° C. However, through the course of experiments to arrive at the present invention, it has been found that when substrates bonded at room temperature are heated to the temperature range of about 250° C. to 350° C., the bonded substrates cause breakage or defects such as an untransferred portion because of the difference between the coefficients of thermal expansion of the two substrates. Furthermore, because a heat treatment suitable for making the ion implantation interface brittle is required, it is not desirable to avoid a heat treatment at 250° C. to 350° C.

As mentioned above, there are problems that substrates may be broken because of a difference in the coefficient of thermal expansion of the bonded substrates, or an untransferred portion of the silicon film occurs as the silicon film is transferred. This is because, although the bonding strength of the bonding interface increases as the temperature increases, simultaneous bonding of substrates of different types causes a warp so that detachment or the like occurs and the bonding does not proceed uniformly in the plane. When these substrates are bonded and then directly subjected to a high temperature treatment, there are problems such as the occurrence of substrate breakage, or detachment of the bonded substrates.

Therefore, owing to a difference in the coefficient of thermal expansion between the semiconductor substrate and the handle substrate, there is a drawback that it is difficult to employ a high temperature process (about 500° C.) for thermal detachment at the hydrogen ion implantation interface, which is carried out after bonding, and application of conventional methods represented by the SOITEC method is difficult.

Examples of the prior art of the above mentioned type can be found in Japanese Patent No. 3048201 and U.S. Pat. Nos. 6,263,941; 6,513,564 and 6,582,999.

SUMMARY OF THE INVENTION

Under such circumstances, the present invention provides a method for manufacturing a bonded wafer, which does not cause substrate breakage due to a difference in the coefficient of thermal expansion at the time of bonding a semiconductor substrate to a handle substrate, and does not generate an untransferred portion as the semiconductor film is transferred.

In order to solve this problem, the present inventors have designed a production method such as described below.

According to the present invention, there is provided a method for manufacturing a bonded wafer comprising a semiconductor film on a surface of a handle substrate, the method comprising the steps of implanting ions into a semiconductor substrate from a surface of a semiconductor substrate to form an ion-implanted layer; subjecting at least one of the surface of the ion-implanted semiconductor substrate and the surface of the handle substrate to a surface activation treatment; bonding, after the surface activation treatment, the surface of the semiconductor substrate to the surface of the handle substrate at a temperature of from 50° C. to 350° C.; heating the bonded substrates at a maximum temperature of from 200° C. to 350° C. to obtain a bonded body; and transferring the semiconductor film to the handle wafer by subjecting the bonded body to a temperature higher by 30° C. to 100° C. than the bonding temperature in the step of bonding, and irradiating the bonded body with visible light from a handle substrate side or a semiconductor substrate side toward the ion-implanted layer of the semiconductor substrate to make the interface of the ion-implanted layer brittle.

According to the present invention, a bonded wafer which does not undergo substrate breakage owing to a difference in the coefficient of thermal expansion at the time of bonding a semiconductor substrate to a handle substrate, and has no untransferred portion as the semiconductor film is transferred, can be produced.

BRIEF DESCRIPTION OF THE DRAWINGS

FIG. 2 exhibits a warp caused by the heat treatment at the time of forming a bonded body;

FIG. 3 exhibits an example of a method for manufacturing a bonded wafer when a semiconductor substrate is transparent;

DETAILED DESCRIPTION OF THE INVENTION

The present invention relates to a method for manufacturing a bonded wafer by forming a semiconductor film on the surface of a handle substrate. The manufacturing method of the present invention can be applied particularly effectively when at least one of a handle substrate and a semiconductor substrate is transparent or has a transmittance of 70% or higher, to light in the entire visible light wavelength range (400 nm to 700 nm) or light at least in the long wavelength range.

The semiconductor substrate preferably includes a substrate that is opaque in the visible light wavelength range, such as a single crystal silicon substrate or a silicon substrate having an oxide film grown thereon, and a substrate that is transparent in the visible light wavelength range, such as a substrate made of GaN, ZnO, diamond or AlN.

The diameter of the semiconductor substrate is preferably 50 mm to 300 mm, and the thickness thereof is not particularly limited, but a thickness close to that defined by the conventional SEMI/JEIDA standards is easily manageable in view of handling.

There are no particular limitation on the handle substrate as long as it is capable of supporting the semiconductor film, and examples include substrates of silicon, silicon with an oxide film, alumina, non-single crystal aluminum nitride, silicon carbide, glass, quartz and sapphire. Preferred examples include substrates of glass, quartz and sapphire.

The diameter of the handle substrate is usually 50 mm to 300 mm, and the thickness thereof is not particularly limited, but a thickness close to that defined by the conventional SEMI/JEIDA standards is easily manageable in view of handling.

A combination of the semiconductor substrate and the handle substrate preferably includes a combination of a semiconductor substrate being transparent in the visible light wavelength range and being selected from GaN, ZnO, diamond and AlN, and a handle substrate being opaque in the visible light wavelength range and being selected from silicon, silicon carbide and AlN (non-single crystal).

Figure 1:
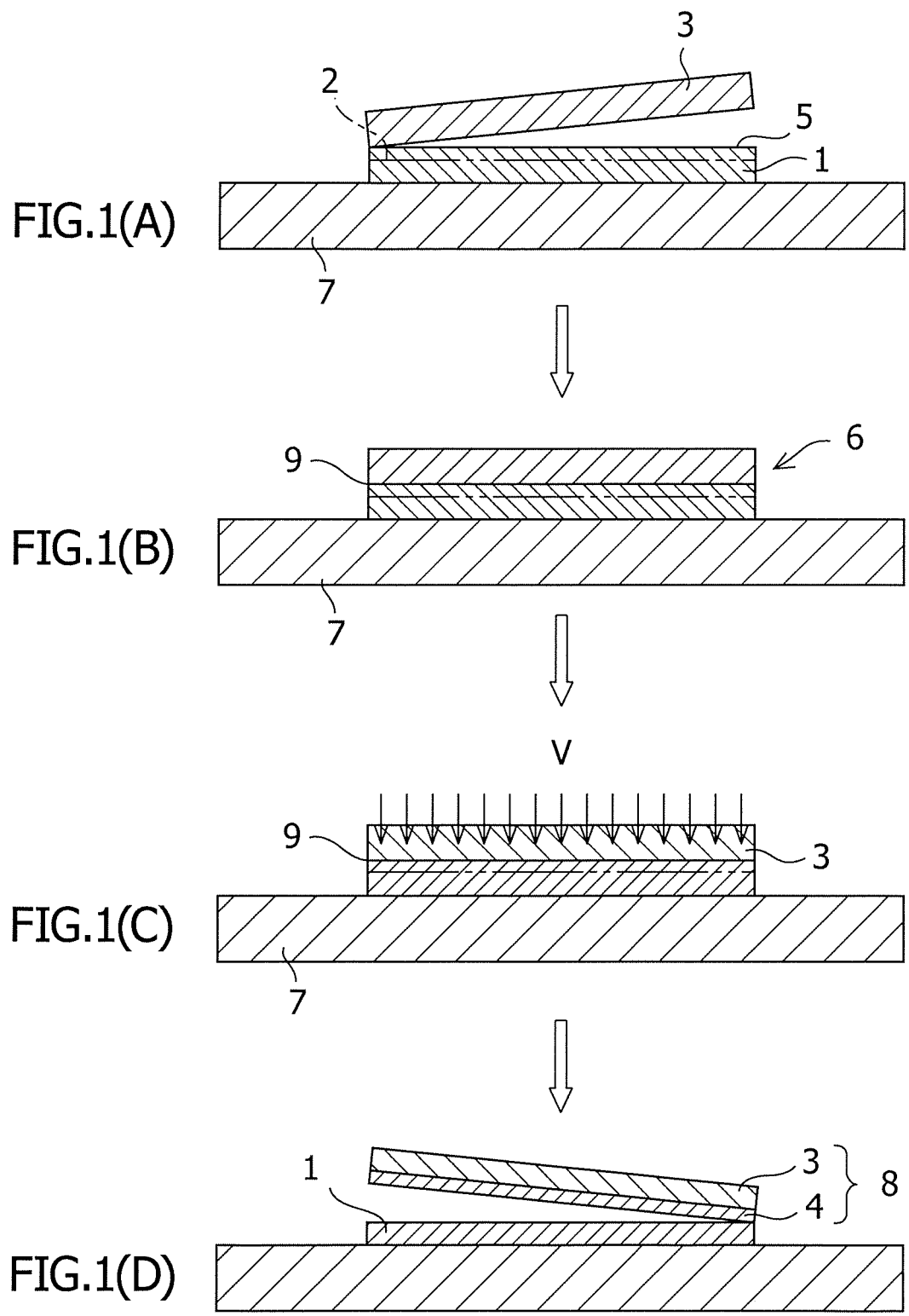
FIG. 1 exhibits an example of a method for manufacturing a bonded wafer when a handle substrate is transparent.

FIG. 1 exhibits an example of the method for manufacturing a bonded wafer of the present invention. Although not shown in FIG. 1, firstly, ions are implanted into a semiconductor substrate 1 from a surface 5 of the semiconductor substrate 1 to form an ion-implanted layer 2, and then at least one of the ion implantation surface 5 of the semiconductor substrate 1 and a bonding surface of a handle substrate 3 is subjected to a surface activation treatment.

According to the present invention, the method comprises a step of implanting ions into a semiconductor substrate 1 from a surface 5 of the semiconductor substrate 1 to form an ion-implanted layer 2, before bonding of the semiconductor substrate 1 to the handle substrate 3. At this time, a predetermined dose of hydrogen ions ($H^+$) or hydrogen molecular ions ($H_2^+$) are implanted with implantation energy which allows the ion-implanted layer 2 to be formed at a desired depth from the surface. As the condition in this case, for example, the implantation energy can be 50 to 100 keV.

The dose of the hydrogen ions ($H^+$) that are implanted into the semiconductor substrate 1 is preferably $5.0 \times 10^{16}$ atoms/cm$^2$ to $2.0 \times 10^{17}$ atoms/cm$^2$. When the dose is less than $5.0 \times 10^{16}$ atoms/cm$^2$, embrittlement of the interface may not occur. When the dose is greater than $2.0 \times 10^{17}$ atoms/cm$^2$, air bubbles may be formed during the heat treatment after bonding, and poor transfer may occur.

When hydrogen molecular ions ($H_2^+$) are used as the implanted ions, the dose is preferably $2.5 \times 10^{15}$ atoms/cm$^2$ to $1.0 \times 10^{17}$ atoms/cm$^2$. When the dose is less than $2.5 \times 10^{15}$ atoms/cm$^2$, embrittlement of the interface may not occur. When the dose is greater than $1.0 \times 10^{17}$ atoms/cm$^2$, air bubbles may be formed during the heat treatment after bonding, and poor transfer may occur.

Furthermore, when an insulating film such as an oxide film having a thickness of about 1 to 500 nm is formed in advance on the surface of the semiconductor substrate 1, and then implantation of hydrogen ions or hydrogen molecular ions is carried out through the insulating film, an effect of suppressing channeling of the implanted ions is obtained.

According to the present invention, the method comprises a step of subjecting the ion implantation surface 5 of the semiconductor substrate 1 and/or the surface of the handle substrate 3 to an activation treatment, after the ion implantation and before the bonding of the semiconductor substrate 1 and the handle substrate 3. Examples of the method for the surface activation treatment include an ozone water treatment, a UV-ozone treatment, an ion beam treatment and a plasma treatment.

The mechanism of increasing a bonding force as a result of surface activation has not yet been completely clarified, but may be explained as follows. In an ozone water treatment, a UV-ozone treatment or the like, activation is carried out by decomposing organic substances on the surface by ozone, and increasing the number of OH groups on the surface. On the other hand, in an ion beam treatment, a plasma treatment or the like, activation is carried out by exposing highly reactive dangling bonds on the wafer surface, or adding OH groups to the dangling bonds. The surface activation can be tested by monitoring the degree of hydrophilicity (wettability). Specifically, the test can be carried out conveniently by dropping water on a wafer surface, and measuring the contact angle.

In the ozone water treatment, the wafer can be immersed in pure water containing dissolved ozone at a concentration of about 10 mg/L.

In the UV-ozone treatment, UV light (for example, 185 nm) can be irradiated to ozone gas or an ozone gas generated from the atmosphere.

In the ion beam treatment, the wafer surface is treated with a beam of an inert gas such as argon under a high vacuum, in the manner similar to a sputtering method, so that dangling bonds at the surface can be exposed and thereby the bonding force can be increased.

In the plasma treatment, a semiconductor substrate and/or a handle substrate is placed in a chamber, and a gas for plasma is introduced into the chamber under reduced pressure. Subsequently, the substrate is exposed to high frequency plasma of about 100 W for about 5 to 10 seconds for the plasma treatment of the surface. As the gas for plasma, in the treatment of a semiconductor substrate, plasma of oxygen gas can be used when the surface is to be oxidized; and hydrogen gas, argon gas, a mixed gas of hydrogen and argon, or a mixed gas of hydrogen gas and helium gas can be used when the surface is not oxidized. In the treatment of a handle substrate, any gas may be used. Through this treatment, organic substances on the surface of the semiconductor substrate and/or the handle substrate are oxidized and removed, and the number of OH groups at the surface is increased, so that the surface is activated.

It is more preferable that one or more of these four treatments are carried out on both of the ion implantation surface of the semiconductor substrate and the bonding surface of the handle substrate, but it is still acceptable to carry out these treatments only on one of the surfaces.

Subsequently, as shown in FIG. 1(A), the ion implantation surface 5 of the semiconductor substrate 1 and the surface of the handle substrate 3 are brought into close contact and bonded at bonded surfaces at a temperature of from 50° C. to 350° C. The bonding temperature in the step of bonding is usually room temperature (around 25° C.). However, when this temperature is increased to a temperature higher than the usual temperature, such as 50° C. or higher, the stress on the bonded interface can be reduced. The lower limit of the bonding temperature is preferably 60° C., 70° C., 80° C., or 90° C., while the upper limit thereof is preferably 290° C., 280° C., 270° C. or 260° C.

The step of bonding is preferably carried out under heating by providing a heat source 7 such as a hot plate or an oven for each of the semiconductor substrate 1 side and the handle substrate 3 side, for the handle substrate 3 side, or for the semiconductor substrate 1 side, and the time for performing the bonding is approximately 1 minute to 10 minutes.

At the time of bonding, the substrate that is brought into contact with the heat source 7 may be the semiconductor substrate 1, or may be the handle substrate 3.

According to the present invention, because the bonding itself is completed in about several minutes; the temperature change during the bonding is not particularly taken into consideration. However, if any temperature change occurs during the bonding, the average temperature is defined as the bonding temperature.

When the substrates having different coefficients of thermal expansion are bonded at room temperature and then heated for the formation of a bonded body as described below, the semiconductor substrate 1 and the handle substrate 3 may be split at a bonding interface 9 because of warping stress, before the bonding strength becomes sufficient. FIG. 2 shows a warp caused by a heat treatment for the formation of a bonded body. The direction of this warp depends on the difference in the coefficient of thermal expansion of the materials.

Accordingly, bonding the substrates at a high temperature allows a warping stress to be reduced in the subsequent heat treatment for the formation of a bonded body 6. Specifically, when the bonding temperature is designated as $T_0$, and the heat treatment temperature is designated as $T_1$, since the stress between the substrates (bonding interface 9) is directly proportional to $(T_1-T_0)$, bringing $T_1$ and $T_0$ as close to each other as possible results in prevention of the split during the heat treatment.

Next, as shown in FIG. 1(B), the bonded substrates are subjected to a heat treatment at a maximum temperature of from 200° C. to 350° C. to obtain the bonded body 6. The reason for performing the heat treatment is to prevent the introduction of crystal defects that is caused by a shift of the bonding interface 9 due to a rapid temperature increase when the bonding interface 9 reaches a high temperature during the irradiation with visible light in the subsequent step. The temperature is set to 200° C. or higher and 350° C. or lower because if the temperature is lower than 200° C., the bonding strength is not increased and if the temperature is higher than 350° C., there is a possibility that the bonded substrates may break up.

As a result of investigation through experiments, the present inventors have found that an appropriate maximum heat treatment temperature for the handle substrate 3 of quartz or glass is from 200° C. to 350° C., and an appropriate maximum heat treatment temperature for the handle substrate 3 of sapphire is from 200° C. to 250° C. This temperature range varies depending on a type of the substrate. The heat treatment may be carried out in two or more stages corresponding to respective divisions of the temperature range.

Although the heat treatment time may vary depending on temperature to a certain extent, it is preferably 12 hours to 72 hours.

Subsequently, the bonded body 6 is subjected to annealing by irradiating the bonded body 6 with visible light for a short time from the semiconductor substrate 1 side or the handle substrate 3 sides toward the ion-implanted layer 2 of the semiconductor substrate 1. FIG. 1(C) and FIG. 1(D) exhibit an example where the handle substrate is transparent, and FIG. 3(A) and FIG. 3(B) exhibit an example where the semiconductor substrate is transparent. Visible light is irradiated from the side of the transparent handle substrate 3 in FIG. 1(C), and from the side of the transparent semiconductor substrate 1 in FIG. 3(A), toward the ion-implanted layer 2 of the semiconductor substrate 1. When both the semiconductor substrate 1 and the handle substrate 3 are transparent in the visible light wavelength range, visible light may be irradiated from either side of the substrates toward the ion-implanted layer 2 of the semiconductor substrate 1.

The term "visible light" as used herein means light having a peak wavelength in the wavelength region of 400 to 700 nm, and in regard to a wavelength, a wavelength capable of reaching the ion-implanted layer 2 of the semiconductor substrate 1 with a smaller energy loss is appropriately selected in accordance with the material of the semiconductor substrate or the handle substrate. The visible light may be either coherent light or incoherent light. The visible light is preferably a laser light.

When at least one of the semiconductor substrate 1 and the handle substrate 3 is transparent in the visible light wavelength range and has a very low coefficient of absorption in the manufacturing method according to the present invention, the site of hydrogen ion implantation absorbs light of this wavelength range, and a chemical reaction is accelerated inside. Consequently, embrittlement occurs at the interface of the ion-implanted layer 2 without the entire surface of the substrate being overheated. As shown in FIG. 1(D) and FIG. 3(B), a semiconductor film 4 is transferred to the handle substrate 3 along the ion-implanted surface, and a bonded wafer 8 can be formed.

Examples of the laser that can be employed for this visible light wavelength range include a green laser with a wavelength of 532 nm, which is used in the crystallization of amorphous silicon for liquid crystal; a second harmonic wave of a Nd:YAG laser (wavelength: 532 nm); a second harmonic wave of a $YVO_4$ laser (wavelength: 532 nm); and an argon laser (wavelength: 514 nm).

The temperature of the bonded body 6 during irradiation with visible light is desirably higher by 30° C. to 100° C. than the bonding temperature.

The reason why it is desirable to perform the light irradiation at a temperature higher by 30° C. to 100° C. than the bonding temperature is considered to be as follows.

In order to cause embrittlement of the ion-implanted area serving as the detachment interface during the irradiation of visible light, it is desirable that the temperature be as high as possible. It has been found that detachment occurs more smoothly due to both the energy of the high temperature of the substrates as a whole and the energy of the irradiation of visible light. However, when substrates that have been bonded at a high temperature are heated to obtain a sufficient bonding strength and then are returned to room temperature, the substrates are warped because of a difference in the coefficient of thermal expansion between the two substrates. It has been found through experiments by the present inventors that when these substrates are irradiated with light, because stress is rapidly released during the transfer of a film so that the substrates tend to return to a flat state, defects are introduced into the semiconductor film to be transferred, or in some cases, the substrates themselves break up.

From the viewpoint of warping, it is desirable to carry out the irradiation at the same temperature as the temperature for bonding. However, from the viewpoint of detachment, it is desirable to carry out the irradiation at a temperature as high as possible. The present inventors have found that detachment can be smoothly achieved without any significant warping by adjusting the temperature at the time of irradiation to be higher by 30° C. to 100° C. than the temperature at the time of bonding. When the difference of temperature (subtraction of temperature at the time of bonding from temperature at the time of irradiation) is larger than 100° C., a large warp occurs in the bonded substrates and it becomes difficult to perform uniform heating of the wafer so that there is a risk of the bonded body cracking at the time of detachment when the warped substrates return to the original flat state. When the difference of temperature is 30° C. or less, a significant effect of improvement is not observed.

Figure 4A:
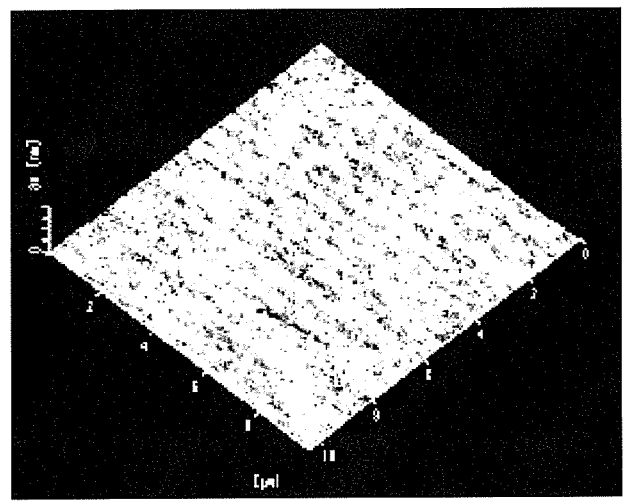
FIG. 4 exhibits the results of an observation of a semiconductor substrate by AFM: (A) immediately after ion implantation, (B) after heating at 350° C., and (C) after heating at 400° C.
Figure 4B:
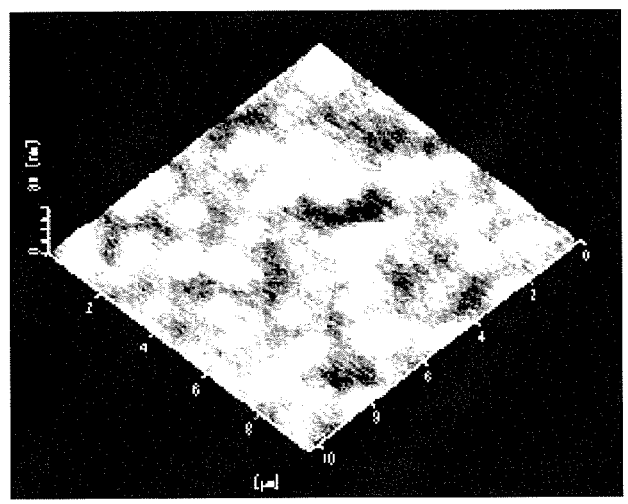
Figure 4C:
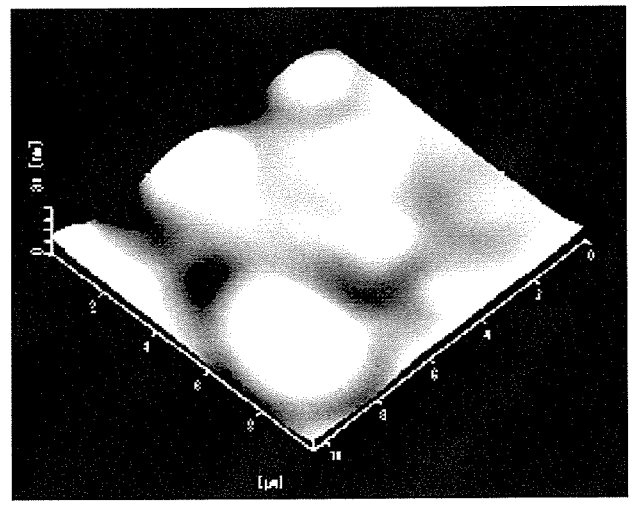

In view of increasing the temperature at the time of detachment, it is seemingly possible to adjust the temperature at the time of bonding to a high temperature (for example, 400° C.), and to carry out the detachment at 400° C. However, when the ion-implanted semiconductor substrate is brought to a high temperature (>350° C.), the implanted ion species in the semiconductor substrate aggregates, air bubbles are formed inside the semiconductor substrate, and the surface is roughened. Consequently, the surface becomes unsuitable for the step of bonding where a smooth surface is required. Therefore, bringing the semiconductor substrate to a high temperature is left to a step subsequent to the step of bonding. FIG. 4(A) exhibits the result of an observation of a semiconductor substrate by AFM immediately after ion implantation, FIG. 4(B) exhibits the result after heating at 350° C. (heating time: 10 minutes), and FIG. 4(C) exhibits the result after heating at 400° C. (heating time: 10 minutes), along with the root-mean-square (RMS) roughness and the arithmetic average roughness (Ra). One division on the vertical axis represents 20 nm, and the entire axis represents 80 nm. At 350° C., slight surface roughness is observed as compared with a product that has not been heat-treated, but this surface roughness is at a level that does not cause a problem in bonding. At 400° C., however, surface unevenness by air bubbles occurs and it is clear that the surface roughness is already at a level that is inappropriate for bonding.

Therefore, in order to achieve smooth detachment, it is ideal to carry out bonding in such a temperature range (350° C. or lower) that air bubbles are not generated, a heat treatment (heat treatment of the bonded substrates) at a temperature of from 200° C. to 350° C., and detachment at a temperature higher by 30° C. to 100° C. than the temperature at the time of bonding.

Since most of the wavelength range of visible light is absorbed only at the ion implantation sites, the transparent substrate is not entirely heated, and energy can be supplied only to the sites (ion implantation sites) where energy is required. Thus, this method is ideal. In addition to this, a synergistic effect can be expected by heating the entire substrate. Since the ion implantation sites have been made sufficiently brittle, a film can be transferred without imposing a load on the substrate.

Caution should be taken here because if the ion-implanted areas are excessively heated by irradiation with laser light, thermal detachment partially occurs and a swelling defect called blister occurs. The blister is observed by visual inspection from the transparent substrate side of the bonded body 6. Once the detachment occurs owing to this blister, stress is localized in the bonded body 6 and causes destruction of the bonded body 6. Accordingly, it is desirable to irradiate the bonded body with laser light to such an extent that the thermal detachment does not take place, or to apply a mechanical impact to the vicinity of the bonding interface 9 at an edge of the bonded body 6 before the irradiation with laser light so that the heat impact applied by the irradiation with laser light is transmitted from the origin of the mechanical impact at the edge to the entire surface of the bonded body 6, causing destruction at the ion implantation interface.

In regard to the conditions for the irradiation with laser light, when the laser light having an oscillation frequency of 25 mJ@3 kHz at an output power of 50 W to 100 W is used, the irradiation energy per unit area is empirically preferably 0.4 J/cm$^2$ to 1.6 J/cm$^2$. When the irradiation energy is less than 0.4 J/cm$^2$, there is a possibility that embrittlement may not occur at the ion implantation interface. When the irradiation energy is greater than 1.6 J/cm$^2$, there is a possibility that embrittlement occurs so strongly that the substrates may be broken. Since irradiation is carried out by scanning spot-shaped laser light on the wafer, it is not easy to specify the time, but it is desirable that the irradiation energy after the treatment is in the range described above.

As the method for the irradiation with visible light, rapid thermal anneal (RTA) including spike anneal that is used in semiconductor processes and the like, is also a useful method. The RTA is an excellent method by which rapid temperature increase and decrease at a rate such as 50 to 150° C./second can be achieved and the process can be completed before warming the entire substrate. At this time, it is important to overheat the vicinity of the ion implantation interface only, to such an extent that thermal detachment does not take place. Since the heat source that is conventionally used in RTA is a halogen lamp, this halogen lamp is suitable as a source for visible light irradiation.

Furthermore, the visible light is preferably flash lamp light, and xenon flash lamp light or the like is also applicable. When the xenon lamp light is used, irradiation may be carried out through a wavelength filter which cuts off light having a wavelength outside the visible light range. Furthermore, a filter or the like which cuts off light in the wavelength range other than the visible light wavelength range which is transparent to the substrate, is also effective in view of stabilization of the process. In order to suppress the occurrence of a blister as described above, it is desirable to simultaneously irradiate the entire surface of the bonded substrates with the xenon lamp light. Through the simultaneous irradiation, localization of stress in the bonded substrates is prevented and thus it is facilitated to prevent destruction of the bonded substrates. Accordingly, it is desirable to irradiate the bonded substrate with xenon lamp light to such an extent that thermal detachment does not take place, or to apply a mechanical impact to the vicinity of the bonding interface 9 at an edge of the bonded body 6 before the irradiation with xenon lamp light so that the heat impact applied by the irradiation with xenon lamp light is transmitted from the origin of the mechanical impact at the edge to the entire surface of the bonded substrates, causing destruction at the ion implantation interface. Preferably comprised is application of a mechanical impact to the vicinity of the bonding interface at an edge of the bonded body, prior to the irradiation with visible light.

After the laser light irradiation, the RTA treatment or the flash lamp irradiation, if the transfer of the semiconductor film 4 to the handle substrate 3 cannot be confirmed, detachment may be carried out by applying a mechanical impact to the interface of the ion-implanted layer 2. Preferably, a mechanical impact is applied to the interface of the ion-implanted layer after the irradiation with visible light, and the bonded body is detached along the interface.

In order to apply the mechanical impact to the interface of the ion-implanted layer 2, for example, a jet of fluid such as a gas or a liquid may be sprayed continuously or intermittently from the lateral side of the bonded body. However, there is no particular limitation as long as mechanical detachment by an impact is generated.

A bonded wafer 8 in which the semiconductor film 4 is formed on the handle substrate 3 is obtained by the detachment step.

The thickness of the semiconductor film 4 can be usually adjusted to 50 nm to 1000 nm.

The present invention also contains the bonded wafer obtained by the method for manufacturing a bonded wafer described above. Application of the bonded wafer includes substrates for electro-optical apparatuses such as projectors, high frequency devices and liquid crystal apparatuses, and substrates for power semiconductors or short wavelength lasers.

EXAMPLES

Examples 1 to 4

A GaN substrate having a diameter of 50 mm was provided as a semiconductor substrate, and subjected to H$^+$ ions implantation in a dose of $9.5 \times 10^{16}$ atoms/cm$^2$ at an accelerating voltage of 75 keV.

A silicon substrate (thickness 280 µm) having a diameter of 50 mm was provided. The ion-implantation surface of the GaN substrate and a surface of the silicon substrate were subjected to an ozone water treatment (in Example 1), a UV-ozone treatment (in Example 2), an ion beam treatment (in Example 3), or a plasma treatment (in Example 4), and thus samples of four kinds in total were produced.

They were bonded in an atmosphere of 150° C. and subjected to a heat treatment at 275° C. for 12 hours to obtain a bonded body. Then, the bonded body was irradiated with a green laser light (wavelength 532 nm) through the transparent substrate side (GaN side) in an environment of 200° C. After the irradiation, a light mechanical impact was applied to the bonding interface, and thereby a film of GaN could be transferred to the silicon substrate. At this time, the thickness of the transferred GaN film was 750 nm. The four kinds of samples were observed with an optical microscope, but no particular defects or the like were found. It could be confirmed that the four kinds of samples had the same product quality so that the product quality is not highly dependent on the type of the surface activation.

Examples 5 to 8 and Comparative Examples 1 to 3

A silicon substrate (thickness 625 µm) having a diameter of 150 mm on which an oxide film had been grown to 200 nm, was provided as a semiconductor substrate, and subjected to hydrogen ions implantation at a dose of $7 \times 10^{16}$ atoms/cm$^2$ at 55 keV.

A sapphire substrate (thickness 600 µm) having a diameter of 150 mm was provided as a handle substrate. The ion implantation surface of the silicon substrate and a surface of the sapphire substrate were subjected to a plasma activation treatment, and were bonded at 200° C.

The bonding was carried out by placing the sapphire substrate on a hot plate, and then placing thereon the silicon substrate that had been heated in the same manner.

Figure 5:
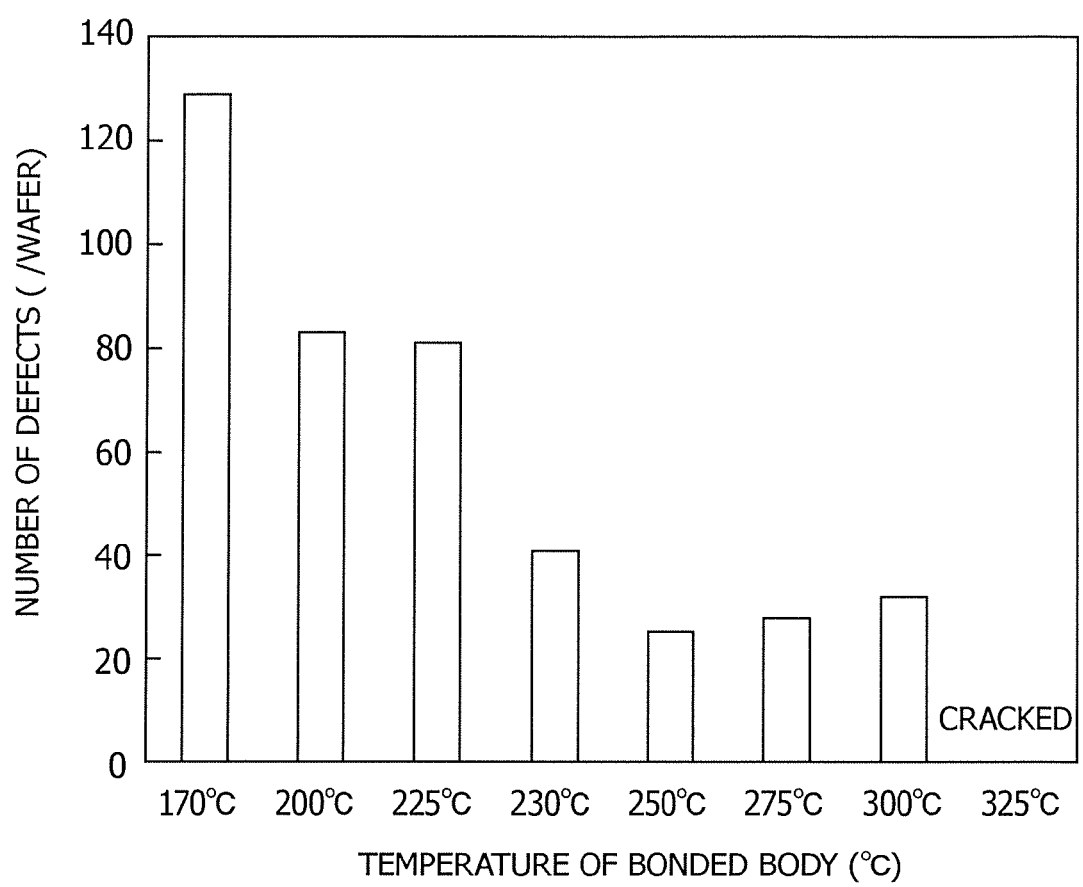
FIG. 5 exhibits the relationship between the temperature of the bonded body irradiated with green laser light and the number of defects.

The bonded substrates were subjected to a heat treatment at 250° C. for 24 hours to obtain a bonded body. The bonded body was irradiated with a green laser light through the sapphire substrate side, on a hot plate of 170° C., 200° C. (in Comparative Example 1), 225° C. (in Comparative Example 2), 230° C. (in Example 5), 250° C. (in Example 6), 275° C. (in Example 7), 300° C. (in Example 8), or 325° C. (in Comparative Example 3). After the entire surfaces of the substrates were irradiated, a mechanical impact was applied to the boning interface for detachment so that a silicon film was transferred to the sapphire substrate. It was found by visual inspection that the bonded body heated at 325° C. was warped on the hot plate, and cracked when irradiated as it was. For the other bonded bodies, transfer of the silicon film could be confirmed. These bonded wafers were immersed in a 50% by weight hydrogen fluoride solution for 10 minutes, and rinsed with pure water. Subsequently, defects on the bonded wafers were counted with an optical microscope. The results are shown in FIG. 5. It is evident in FIG. 5 that the bonded bodies heated at 230° C. or higher provided a smaller number of defects than the bonded bodies irradiated at 200° C. From these results, it is clearly adequate that the temperature at the time of irradiation is higher by about 30° C. to 100° C. than the temperature as the time of bonding.

Example 9

A silicon substrate (thickness 625 µm) having a diameter of 150 mm on which an oxide film had been grown to 200 nm was provided as a semiconductor substrate, and subjected to hydrogen ions implantation at a dose of $8 \times 10^{16}$ atoms/cm$^2$ at an accelerating voltage of 55 keV.

A sapphire substrate (thickness 600 µm) having a diameter of 150 mm was provided as a handle substrate. The ion implantation surface of the silicon substrate and a surface of the sapphire substrate were subjected to a plasma activation treatment, and bonded at 200° C.

The bonding was carried out by placing the sapphire substrate on a hot plate, and then placing thereon the silicon substrate that had been heated in the same manner.

The bonded substrates were subjected to a heat treatment at 250° C. for 24 hours to obtain a bonded body. The bonded body was irradiated with a green laser light (wavelength 532 nm) from the sapphire substrate side on a hot plate of 250° C. After the entire surfaces of the boned body were irradiated, a mechanical impact was applied to the bonding interface for detachment so that a silicon film was transferred to the sapphire substrate. Transfer of the silicon film to the entire surface of the substrate could be confirmed. The number of defects was 29, which was almost same as that of the product of Example 6 that had been subjected to irradiation at 250° C.

Example 10

A silicon substrate (thickness 625 µm) having a diameter of 150 mm on which an oxide film has been grown to 200 nm was provided as a substrate semiconductor, and subjected to hydrogen ions implantation at a dose of $8\times10^{16}$ atoms/cm² and at an accelerating voltage of 55 keV.

A sapphire substrate (thickness 600 μm) having a diameter of 150 mm was provided as a handle substrate. The ion implantation surface of the silicon substrate and a surface of the sapphire substrate were subjected to a plasma activation treatment, and bonded at 200° C.

The bonding was carried out by placing the sapphire substrate on a hot plate, and then placing thereon the silicon substrate that had been heated in the same manner.

The bonded substrates were subjected to a heat treatment at 250° C. for 24 hours to obtain a bonded body. The bonded body was subjected to RTA and was maintained at 250° C. The bonded body was placed in such a direction that the temperature at the bonding interface could be observed with a pyrometer through the sapphire substrate side. At this time, the temperature of the vicinity of the bonding interface could be observed. After the bonded body was maintained at 250° C., the temperature was increased at a rate of 50° C./sec to 350° C. (by pyrometer reading). Simultaneously with the pyrometer reading arriving at 350° C., the electric power was turned off to cool the bonded body. After the treatment, a mechanical impact was applied to the bonding interface for detachment so that a silicon film was transferred to the sapphire substrate. Transfer of the silicon film to the entire surface of the substrate could be confirmed. The number of defects was 32, which was almost same as that of the product of Example 6 that had been subjected to irradiation at 250° C.

Example 11 and Comparative Example 4

A GaN substrate having a diameter of 50 mm was provided as a semiconductor substrate, and subjected to H⁺ ions implantation at a dose of $9.5\times10^{16}$ atoms/cm² at an accelerating voltage of 75 keV.

A silicon substrate (thickness 280 μm) having a diameter of 50 mm was provided as a handle substrate. The ion implantation surface of the GaN substrate and the surface of the silicon substrate were subjected to a UV-ozone activation treatment.

The substrates were bonded in an atmosphere of 200° C., and subjected to a heat treatment at 275° C. for 12 hours to obtain a bonded body. The bonded body was irradiated with Xe flash lamp light through the transparent substrate side (GaN side) in an environment of 200° C. (in Comparative Example 4) or 250° C. (in Example 11). The pulse width was set to about 1 millisecond. After the irradiation, a light mechanical impact was applied to the bonding interface so that a GaN film could be transferred to the silicon substrate. At this time, the thickness of the transferred GaN film was 750 nm. Untransferred micro portions were observed by visual inspection in the bonded wafer for the irradiation at 200° C., but no defect was observed in the bonded body for the irradiation at 250° C.

Example 12 and Comparative Example 5

A ZnO substrate having a diameter of 50 mm was provided as a semiconductor substrate, and subjected to H⁺ ions implantation at a dose of $9.5\times10^{16}$ atoms/cm² at an accelerating voltage of 80 keV.

A silicon substrate (thickness 280 μm) having a diameter of 50 mm was provided as a handle substrate. The ion-implanted surface of the ZnO substrate and the surface of the silicon substrate were subjected to a UV-ozone activation treatment.

The substrates were bonded in an atmosphere of 200° C., and subjected to a heat treatment at 275° C. for 12 hours to obtain a bonded body. The bonded body was irradiated with Xe flash lamp light through the transparent substrate side (ZnO side), Keeping the temperature of the bonded body at 200° C. (in Comparative Example 5) or 250° C. (in Example 12). The pulse width was set to about 1 millisecond. After the irradiation, a light mechanical impact was applied to the bonding interface so that a ZnO film could be transferred to the silicon substrate. Untransferred micro portions were observed by visual inspection in the bonded wafer for the irradiation at 200° C., but no defect was observed in the bonded wafer for the irradiation at 250° C. At this time, the thickness of the transferred ZnO film was 850 nm.

Example 13 and Comparative Example 6

A GaN substrate having a diameter of 50 mm was provided as a semiconductor substrate, and subjected to H⁺ ions implantation at a dose of $9.5\times10^{16}$ atoms/cm² at an accelerating voltage of 75 keV.

A sapphire substrate (thickness 280 μm) having a diameter of 50 mm was provided as a handle substrate. The ion-implantation surface of the GaN substrate and the surface of the sapphire substrate were subjected to a plasma activation treatment.

They were bonded in an atmosphere of 200° C., and then subjected to a heat treatment at 250° C. for 24 hours to obtain a bonded body. The bonded body was irradiated with Xe flash lamp light through the sapphire substrate side, keeping the temperature of the bonded body at 200° C. (in Comparative Example 6) or 250° C. (in Example 13). The pulse width was set to about 1 millisecond. After the irradiation, a light mechanical impact was applied to the bonding interface so that a GaN film could be transferred to the sapphire substrate. Untransferred extremely micro portions were observed by visual inspection in the bonded wafer for the irradiation at 200° C., but no defect was observed in the bonded wafer for the irradiation at 250° C. At this time, the thickness of the transferred GaN film was 750 nm.

The invention claimed is:

1. A method for manufacturing a bonded wafer comprising a semiconductor film on a surface of a handle substrate, the method comprising the steps of:
    implanting ions into a semiconductor substrate from a surface of the semiconductor substrate to form an ion-implanted layer;
    subjecting at least one of the surface of the ion-implanted semiconductor substrate and the surface of the handle substrate to a surface activation treatment;
    bonding, after the surface activation treatment, the surface of the semiconductor substrate to the surface of the handle substrate at a temperature of from 50° C. to 260° C.;
    heating the bonded substrates at a maximum temperature of from 200° C. to 350° C. to obtain a bonded body; and
    transferring the semiconductor film to the handle wafer by subjecting the bonded body to a temperature higher by 30° C. to 100° C. than the bonding temperature in the step of bonding, and irradiating the bonded body with visible light from a handle substrate side or a semiconductor substrate side toward the ion-implanted layer of the semiconductor substrate to make an interface of the ion-implanted layer brittle due to both an energy of the higher temperature and an energy of the visible light,
    wherein the step of transferring comprises applying a mechanical impact to the interface of the ion-implanted layer for detachment along the interface, after the irradiation with visible light to such an extent that thermal detachment does not take place; or applying a mechanical impact to a vicinity of an interface between the bonded substrates at an edge of the bonded body, before the irradiation with visible light so that heat impact applied by the irradiation with the light is transmitted from an origin of the mechanical impact at the edge to an entire surface of the bonded body, causing destruction at the interface.

2. The method for manufacturing a bonded wafer according to claim 1, wherein the surface activation treatment comprises one or more treatments selected from the group consisting of an ozone water treatment, a UV-ozone treatment, an ion beam treatment and a plasma treatment.

3. The method for manufacturing a bonded wafer according to claim 1, wherein the handle substrate is made of glass, quartz or sapphire.

4. The method for manufacturing a bonded wafer according to claim 1, wherein the semiconductor substrate is made of GaN, ZnO, diamond or AlN.

5. The method for manufacturing a bonded wafer according to claim 1, wherein the semiconductor substrate is made of single crystal silicon, or silicon with an oxide film grown thereon.

6. The method for manufacturing a bonded wafer according to claim 1, wherein the semiconductor substrate is made of GaN, ZnO, diamond or AlN, and the handle substrate is made of silicon, silicon carbide or AlN (non-single crystal).

7. The method for manufacturing a bonded wafer according to claim 1, wherein the visible light is laser light.

8. The method for manufacturing a bonded wafer according to claim 1, wherein the visible light is of rapid thermal anneal (RTA) comprising spike anneal.

9. The method for manufacturing a bonded wafer according to claim 1, wherein the visible light is flash lamp light.

10. The method for manufacturing a bonded wafer according to claim 1, wherein the implanted ions are hydrogen atomic ions ($H^+$), and a dose of the hydrogen ions ($H^+$) is from $5 \times 10^{16}$ atoms/cm$^2$ to $2 \times 10^{17}$ atoms/cm$^2$.

11. The method for manufacturing a bonded wafer according to claim 1, wherein the implanted ions are hydrogen molecular ions ($H_2^+$), and a dose of the hydrogen molecular ions ($H_2^+$) is from $2.5 \times 10^{15}$ atoms/cm$^2$ to $1 \times 10^{17}$ atoms/cm$^2$.

* * * * *